June 9, 1953 J. I. PANTCHECHNIKOFF 2,641,638

LINE-CONTACT TRANSISTOR

Filed March 27, 1952

INVENTOR
JACQUES I. PANTCHECHNIKOFF
BY H. C. Newton
ATTORNEY

Patented June 9, 1953 2,641,638

UNITED STATES PATENT OFFICE 2,641,638

LINE-CONTACT TRANSISTOR

Jacques I. Pantchechnikoff, Princeton, N. J., assignor to Radio Corporation of America, a corporation of Delaware Application March 27, 1952, Serial No. 278,805

7 Claims. (Cl. 175—366)

This invention relates generally to semi-conductor devices suitable for use in amplifier and the like circuits, and more particularly relates to a transistor of the type having line contact electrodes.

In applicant's copending application, Serial No. 84,672, filed March 31, 1949, entitled "Semi-Conductor Devices" and assigned to the assignee of this application, there has been disclosed a semi-conductor device or transistor provided with a pair of line contact electrodes. These line contact electrodes may be used as the emitter and collector electrodes of the device respectively, while a third electrode, the base electrode, is in low-resistance contact with the semi-conducting body. The provision of line contact electrodes improves the geometry of the device and thereby the electric field configuration so that a larger portion of the injected charge carriers, which may be "holes" or electrons, can be collected. Preferably, the line contact electrodes consist each of a wire or filamentary conductor which is pressed into intimate contact with the semi-conducting body or crystal.

U. S. Patent 2,580,027, granted on December 25, 1951, to H. Johnson and assigned to the assignee of this application discloses an improved line contact transistor. The Johnson transistor comprises two semi-conducting bodies between which are provided two filamentary conductors or fine metallic wires which provide the emitter and collector electrodes. A separate base electrode may be in low-resistance contact with each of the bodies. Such a device represents a single amplifier device having a larger current carrying capacity because the currents flowing between emitter and collector may pass through either one of the two semi-conducting bodies. In accordance with the present invention, the Johnson line contact transistor is modified so as to provide a device which may be used as a two-stage amplifier.

It is accordingly an object of the present invention to provide an improved line contact transistor device.

A further object of the invention is to provide an improved transistor device of the line contact type which is adapted to provide a twin amplifier device suitable, for example, in two-stage amplifier or push-pull amplifier circuits.

The line contact transistor device of the present invention comprises two bodies of semi-conducting material having two surfaces facing each other. A first filamentary conductor which may form the emitter is in rectifying contact with the surfaces of both bodies. A further pair of filamentary conductors may form two individual collector electrodes and each conductor is in contact with only one surface of the two bodies. It is, of course, feasible to make the first conductor the collector and the pair of conductors individual emitters of the device. These three conductors are disposed substantially parallel and closely adjacent to each other. A base electrode is provided in low-resistance contact with each of the two bodies. Means are provided for causing an intimate contact between the first conductor and both of the bodies and between the pair of conductors and their associated bodies. The resulting transistor device accordingly has a single emitter electrode, two collectors and two base electrodes.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
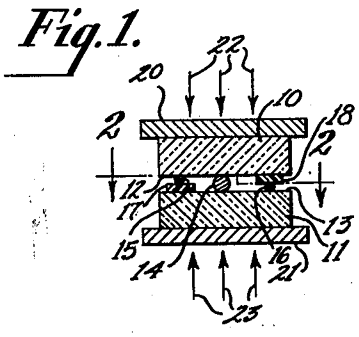
Figure 1 is a cross-sectional view of a transistor device embodying the present invention.
Figure 2:
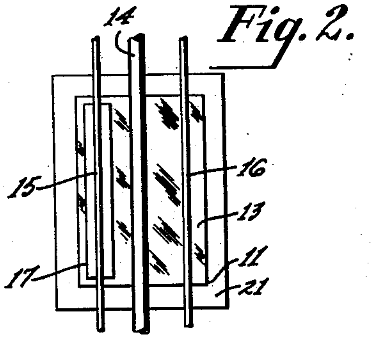
Figure 2 is a sectional view of the device of Figure 1 taken on line 2—2 of Figure 1.

Referring now to the drawing in which like components are designated by the same reference numerals throughout the figures and particularly to Figures 1 and 2, there is illustrated a transistor device comprising a body or block 10 of semi-conducting material. Block 10 may, for example, consist of silicon or preferably of germanium which may be of the N type now well known in the art. A second block 11 of the same material as block 10 is provided. The two blocks 10 and 11 preferably have plane surfaces 12, 13 facing each other although the surfaces 12 and 13 may be curved as long as they are parallel to each other.

A central filamentary conductor 14 such as a fine metallic wire is disposed between the plane surfaces 12 and 13 of blocks 10 and 11. As clearly shown in Figure 1, wire 14 is in contact with both surfaces 12 and 13. A further pair of filamentary conductors 15 and 16 is provided between the blocks 10 and 11. Conductors 15 and 16 may also consist of fine metallic wires and are disposed substantially parallel to wire 14 and closely adjacent to each other. As clearly shown in Figure 1, wire 15 is in contact only with the surface 12 of the block 10, while wire 16 is in contact only with the surface 13 of the block 11. The central wire 14 may form the emitter electrode which is common to both the blocks 10 and 11, while the wires 15 and 16 may form individual collector electrodes. However, wire 14 may also form the collector in which case wires 15 and 16 provide two emitters.

Wire 14 has a diameter which is larger than that of the wires 15 and 16. Wires 15 and 16 are maintained in intimate contact with their respective surfaces 12 and 13 by means of insulating strips 17 and 18 which have such thickness that the wires 15 and 16 will be pressed into contact with their respective surfaces 12 and 13 when the central wire 14 is in contact with both of these surfaces.

A suitable slab of metal 20 is in low-resistance or ohmic contact with the body 10. A similar slab of metal 21 is in low-resistance contact with the body 11. The metallic slabs 20 and 21 form two base electrodes in contact with their respective bodies 10 and 11.

The line contact electrodes or wires 14, 15, 16 are mechanically pressed against the surfaces 12 and 13. This may be effected by pressing the slabs 20 and 21 against each other as indicated schematically in Figure 1 by the arrows 22 and 23. This mechanical pressure will insure intimate contact between wire 14 and the surfaces 12 and 13 of the blocks 10 and 11, between the wire 15 and the surface 12 and finally between the wire 16 and the surface 13. Thus intimate substantially line contact between the major portion of the length of each of the wires 14, 15 and 16 and its associated body or bodies is provided.

It will be understood that surfaces 12 and 13 may be ground or polished and etched as is conventional. Wires 14, 15 and 16 may consist, for example, of tungsten, nickel, beryllium, copper or Phosphor bronze. Preferably, the wires 14—16 consist of a metal which is softer than the blocks 10 and 11. Thus, if blocks 10 and 11 consist of germanium which is a comparatively hard material, the central wire 14 may, for example, consist of tungsten and may have a diameter of two mils. The wires 15 and 16 may consist of Phosphor bronze and may have a diameter of one mil. In that case, the insulating strips 17, 18 may consist of mica sheets having a thickness of one mil. The spacing between the central wire 14 and wires 15 and 16 should be equal and may amount, for example, to two mils. However, it is to be understood that the spacing between wire 14 and 15 on the one hand or wire 16 on the other hand may be considerably larger than two mils.

Thus, the wire 14 may form a common emitter electrode for the two amplifier devices, each of which comprises a collector electrode formed by either wire 15 or 16 and a base electrode provided by metallic slab 20 or 21.

Figure 3:
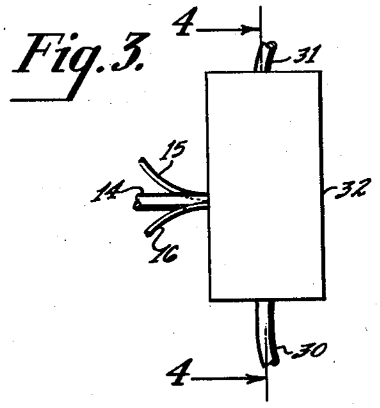
Figure 3 is a side elevational view of a preferred modification of the transistor device in accordance with the invention.
Figure 4:
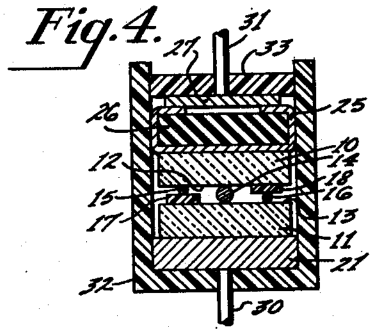
Figure 4 is a sectional view of the device of Figure 3 taken on line 4—4 of Figure 3.

Referring now to Figures 3 and 4, there is illustrated a preferred modification of the line contact transistor of the invention. The device again consists of two blocks 10 and 11 of semiconducting material having substantially parallel surfaces 12 and 13 respectively. The central wire 14 is in line contact with both surfaces 12 and 13, while the wire 15 is in contact with surface 12 and the wire 16 is in contact with surface 13. The insulating strips 17 and 18 respectively insulate the wires 15 and 16 from the surfaces 13 and 12. The metallic slab 21 forms a base electrode for the block 11.

The base electrode for the block 10 may be provided by a metallic foil 25 which may, for example, consist of copper and which may enclose a pad 26 of yieldable material such as rubber. A metallic sheet 27 which may, for example, consist of brass is in electric contact with the copper foil 25. Wires 30 and 31 are in electric contact with the metallic slab 21 and with the metallic sheet 27 respectively, thereby to provide an electrical connection to the two base electrodes. As clearly shown in Figure 3, the wires 14, 15 and 16 may extend from the plastic housing 32 which encloses the device of the invention. A cover 33 also consisting of a plastic insulating material may have a press fit with the housing 32 so as to provide the desired contact pressure between the line contact electrodes 15—17 and their associated bodies when the cover 33 is pressed into the housing 32. The rubber pad 26 will distribute the pressure exerted by cover 33 so as to press each of the wires 15, 16, 17 with a uniform pressure against their associated bodies.

Figure 5:
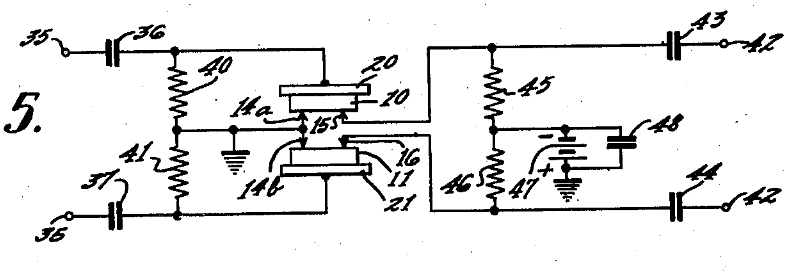
Figure 5 is a circuit diagram of a push-pull amplifier circuit including the transistor device of the invention.

Referring now to Figure 5 there is illustrated a push-pull amplifier circuit which makes use of the transistor device of the invention. The device of the invention has been shown schematically in Figure 5. One of the transistor devices includes the body 10, emitter electrode *14a*, collector electrode 15 and the base 20, while the other device comprises the body 11, emitter *14b*, collector 16 and base 21. The two emitters *14a* and *14b* are, of course, identical as shown in Figures 1–4. A push-pull input signal, which should be balanced with respect to ground, is impressed on the input terminals 35 which are coupled through coupling capacitors 36, 37 to the two base electrodes 20, 21. The emitter electrodes *14a* and *14b* are grounded as shown and are connected to the bases 20, 21 through impedance elements such as resistors 40, 41.

The output signal is derived from the two collectors 15, 16 and may be obtained from output terminals 42 which are coupled to the collectors through coupling capacitors 43, 44. The output load resistors 45 and 46 are connected individually between the two collectors 15, 16 and a source of bias voltage such as battery 47, which may be bypassed for signal frequency currents by capacitor 48. Battery 47 has its positive terminal grounded while its negative terminal is connected to the junction point of the two load resistors 45, 46. The required emitter bias voltage may be developed across the resistors 40 and 41 as is conventional.

The circuit of Figure 5 is conventional and an amplified push-pull signal is derived from the output terminals 42, which is an amplified replica of the input signal.

Figure 6:
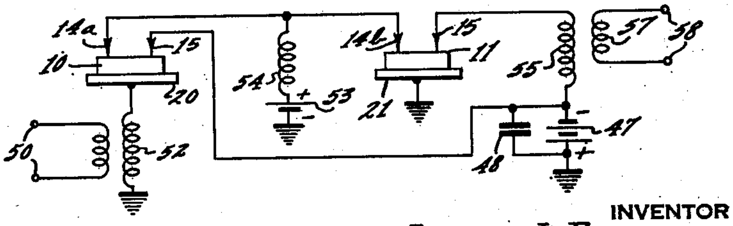
Figure 6 is a circuit diagram of a two-stage amplifier circuit utilizing the device of the invention.

The device of the invention may also be utilized in a two-stage amplifier circuit of the type illustrated in Figure 6. The amplifier circuit of Figure 6 has been disclosed and claimed in a copending application to W. M. Webster, Jr., Serial No. 72,152, filed on January 22, 1949, and assigned to the assignee of this application, now Patent No. 2,595,496. An input signal to be amplified may be impressed on input terminals 50 across which is connected an inductor 51 magnetically coupled to the inductor 52 connected between base 20 and ground. The collector 15 of the first amplifier stage is directly connected to the battery 47. The emitter 14a of the first amplifier stage is connected to an emitter bias battery 53 through inductor 54 which forms the output load impedance element. Accordingly, the first amplifier stage is a grounded collector amplifier having base input and emitter output.

The second amplifier stage has its base 21 grounded while the input signal developed across inductor 54 is impressed on the emitter 14b. The amplified output signal is developed across inductor 55 connected between battery 47 and collector 15. Accordingly, the second amplifier stage is a grounded base transistor having emitter input and collector output. The amplified output signal may be obtained from output coil 57 inductively coupled to coil 55, and the output signal may be obtained from output terminals 58. It is believed that the operation of the two-stage amplifier of Figure 6 will be evident from the above description.

If wire 14 forms the common collector while wires 15 and 16 represent two separate emitter electrodes, the device of the invention may be used to add two input signals. The two input signals are individually impressed on the two emitters and an amplified output signal representative of the added input signals is derived from the collector.

There has thus been disclosed a transistor device of the line contact type which provides two amplifiers having a common emitter electrode. A device of this type may, for example, be used in a push-pull or in a two-stage amplifier circuit. The device of the invention has a larger current carrying capacity than that of a conventional transistor device having point contact electrodes.

What is claimed is:

1. A transistor device comprising two bodies of semi-conducting material, each having a discrete surface area, a first filamentary conductor providing a first electrode in contact with both of said surface areas, a second filamentary conductor providing a second electrode in contact with only one of said surface areas, a third filamentary conductor providing a third electrode in contact with only the other one of said surface areas, said conductors being disposed substantially parallel and closely adjacent to each other, an additional electrode in low-resistance contact with another surface area of each of said bodies, and means for providing and maintaining intimate contact between said conductors and the respective surface areas of said bodies.

2. A transistor device comprising two bodies of semi-conducting material, each having a surface area, said surface areas facing each other and extending substantially parallel to each other, a first filamentary conductor providing a first electrode in contact with both of said surface areas, a second filamentary conductor providing a second electrode in contact with one of said surface areas, a third filamentary conductor providing a third electrode in contact with only the other one of said surface areas, said conductors consisting of metal and being disposed substantially parallel and closely adjacent to each other, an additional electrode in low-resistance contact with another surface area of each of said bodies, and means for providing and maintaining intimate contact between said conductors and the respective surface areas of said bodies.

3. A transistor device comprising two bodies of semi-conducting material, each having a substantially plane surface, said surfaces facing each other, a first fine metallic wire forming a first electrode and in contact with both of said surfaces, a second fine metallic wire forming a second electrode and in contact with one of said surfaces, a third fine metallic wire forming a third electrode and in contact with the other one of said surfaces, said wires being disposed substantially parallel and closely adjacent to each other, an additional electrode in low-resistance contact with another surface area of each of said bodies, and means for providing and maintaining intimate contact between said first wire and both of said bodies and between said second and third wires and their associated body.

4. A transistor device adapted for use as a two-stage amplifier or the like and comprising a first and a second body of semi-conducting material, each having a substantially flat surface, said surfaces facing each other, a first filamentary conductor provided between said surfaces and in contact with both of said surfaces, said first conductor providing an emitter electrode, a second and a third filamentary conductor, each having a diameter less than that of said first conductor, said second conductor being in contact with the flat surface of said first body only and providing a first collector electrode, said third conductor being in contact with the flat surface of said second body only and providing a second collector electrode, said conductors being disposed substantially parallel and closely adjacent to each other, a pair of base electrodes, each being in low-resistance contact with one of said bodies, and means for pressing said first conductor against both of said bodies and said second and third conductors against said first and second body respectively to provide intimate substantially line contact between the major portion of the length of each of said conductors and its associated body or bodies.

5. A transistor device adapted for use as a two-stage amplifier or the like and comprising a first and a second body of semi-conducting material, each having a substantially flat surface, said surfaces facing each other, a first fine wire provided between said surfaces and a contact with both of said surfaces, said first wire providing an emitter electrode, a second and a third fine wire, each having a diameter less than that of said first wire, said second wire being in contact with the flat surface of said first body and providing a first collector electrode, said third wire being in contact with the flat surface of said second body and providing a second collector electrode, said wires consisting of metal and being disposed substantially parallel and closely adjacent to each other, a pair of base electrodes, each being in low-resistance contact with one of said bodies, and means for pressing said first wire against both of said bodies and said second and third wires against said first and second body respectively to provide intimate substantially line contact between the major portion of the length of each of said wires and its associated body or bodies.

6. A device as defined in claim 5 wherein said bodies consist of germanium and wherein said wires consist of a metal substantially softer than germanium.

7. A transistor device adapted for use as a two-stage amplifier or the like and comprising a first and a second body of semi-conducting material, each having a substantially flat surface, said surfaces facing each other, a first filamentary conductor provided between said surfaces and in contact with both of said surfaces, said first conductor providing an emitter electrode, a second and a third filamentary conductor, each having a diameter less than that of said first conductor, a first member of insulating material disposed with said second conductor between said bodies so that said second conductor is in contact with the flat surface of said first body to provide a first collector electrode, a second member of insulating material disposed with said third conductor between said bodies so that said third conductor is in contact with the flat surface of said second body to provide a second collector electrode, said conductors being disposed substantially parallel and closely adjacent to each other, and a pair of base electrodes, each being in low-resistance contact with one of said bodies, said members having a thickness such that said second and third conductors are pressed against said first and second body respectively when said first conductor is pressed against both of said bodies to provide intimate substantially line contact between the major portion of the length of each of said conductors and its associated body or bodies.

JACQUES I. PANTCHECHNIKOFF.

References Cited in the file of this patent

UNITED STATES PATENTS

| Number | Name | Date |
|---|---|---|
| 2,402,661 | Ohl | June 25, 1946 |
| 2,580,027 | Johnson | Dec. 25, 1951 |
| 2,595,497 | Webster | May 6, 1952 |